(12) United States Patent
Tang et al.

(10) Patent No.: US 8,743,581 B2
(45) Date of Patent: *Jun. 3, 2014

(54) MEMORY DEVICES HAVING BREAK CELLS

(71) Applicant: Taiwan Semiconductor Manufacturing Co., Ltd., Hsin-Chu (TW)

(72) Inventors: Yukit Tang, Sunnyvale, CA (US); Kuoyuan Hsu, San Jose, CA (US); Derek Tao, Fremont, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 24 days.

This patent is subject to a terminal disclaimer.

(21) Appl. No.: 13/765,704

(22) Filed: Feb. 13, 2013

(65) Prior Publication Data

US 2013/0155751 A1    Jun. 20, 2013

Related U.S. Application Data

(63) Continuation of application No. 12/870,925, filed on Aug. 30, 2010, now Pat. No. 8,400,804.

(51) Int. Cl.
*G11C 15/02*    (2006.01)
*G11C 11/00*    (2006.01)

(52) U.S. Cl.
USPC .......... 365/51; 365/49.1; 365/49.11; 365/154

(58) Field of Classification Search
CPC ............ G11C 5/00; G11C 5/025; G11C 5/02; G11C 7/18; G11C 11/417; G11C 16/24; G11C 11/412; G11C 11/413; G11C 11/419
USPC .............. 365/51, 226, 202, 205, 230.06, 199, 365/229, 228, 227, 236, 230.03, 289.11, 365/189.06, 49.1, 49.11, 154
See application file for complete search history.

(56) References Cited

U.S. PATENT DOCUMENTS

| | | | |
|---|---|---|---|
| 6,459,642 B1 | 10/2002 | Cho et al. | |
| 7,023,761 B1* | 4/2006 | Tran | 365/227 |
| 8,400,804 B2* | 3/2013 | Tang et al. | 365/51 |
| 2005/0083757 A1* | 4/2005 | Hsu et al. | 365/222 |
| 2005/0199825 A1 | 9/2005 | Moffatt | |
| 2007/0030742 A1* | 2/2007 | Lunde et al. | 365/200 |
| 2009/0116286 A1 | 5/2009 | Chong et al. | |

* cited by examiner

*Primary Examiner* — Thao H Bui
(74) *Attorney, Agent, or Firm* — Duane Morris LLP

(57) ABSTRACT

A representative memory device includes a cell array, at least one break cell that subdivides the cell array into bit cell arrays, and one or more power switches that are electrically coupled to the bit cell. In one embodiment, the break cell separates a connectivity of a first voltage and a second voltage between at least two bit cell arrays so that the bit cell arrays can be selectively coupled to either the first voltage or the second voltage using the power switches. The power switches control the connection of each separated bit cell array of the cell array to either the first voltage or second voltage.

18 Claims, 6 Drawing Sheets

US 8,743,581 B2

MEMORY DEVICES HAVING BREAK CELLS

CROSS-REFERENCE TO RELATED APPLICATIONS

This application is a continuation of U.S. patent application Ser. No. 12/870,925, filed Aug. 30, 2010, the entirety of which is herein incorporated by reference.

TECHNICAL FIELD

The present invention relates generally to electrical circuits, especially memory devices with arrays of sequential conductively-coupled adjacent bit cells, and more particularly memory devices having break cells that are inserted into rows or columns of otherwise conductively coupled sequences of such cells, wherein switches controllably couple operational voltages to discrete subsets of an array of memory cells when needed, the switches being arranged between supply voltages or selected supply voltages, and the cells that are near-by or adjacent the break cells.

BACKGROUND

Typically, memory devices, such as static random access memory (SRAM) devices, consume power during activation, such as when switching from a data retention mode into an operational mode for writing to the memory devices or when coupling power to the memory devices to enter a write-assist mode. This is because the virtual power (e.g., VDDI) and ground (e.g., VSSI) voltages are brought up to an operational level, i.e., a larger potential difference is coupled across the bit cell array of the memory device to make the bit cells operational. Power is consumed when the cells are charged or discharged to a higher potential defined between voltages VDD/VSS, respectively. The active power consumption depends on the capacitance of the entire circuit coupled between the VDDI/VSSI nodes, which is charged when the power supply voltages are applied.

When the memory device is switched from the retention mode to the operational mode, the entire bit cell array of the memory devices may be switched into the active mode and consume power in becoming operational, even if, for example, only one row of bit cells actually is being accessed for updating their content or the like. This results in large power consumption when switching and also static power consumption while remaining in the operational mode. Currently, the issue can be addressed with a Local IO (LIO) circuit that selects an active memory area to be powered. But a full function LIO occupies huge circuit area, which is not desirable.

An improved technique for selectively charging and powering bit cells in a memory device design would be advantageous.

BRIEF DESCRIPTION OF THE DRAWINGS

The accompanying drawings illustrate preferred embodiments of the invention, as well as other information pertinent to the disclosure, in which.

DETAILED DESCRIPTION

Exemplary systems are discussed with reference to the figures. Although these systems are described in detail, they are provided for purposes of illustration only and various modifications are feasible within the scope of the subject matter claimed.

In general, the disclosed memory devices are configured to reduce static and active power consumption as well as to reduce noise when the memory devices switch from a data retention mode to an operational mode or from/to a write-assist mode. These switching conditions are when a potential difference or an increased potential difference is applied to the bit cells of the device, and due to inherent capacitance requires the bit cells to charge up to the applied potential difference, thereby consuming power.

Figure 1:
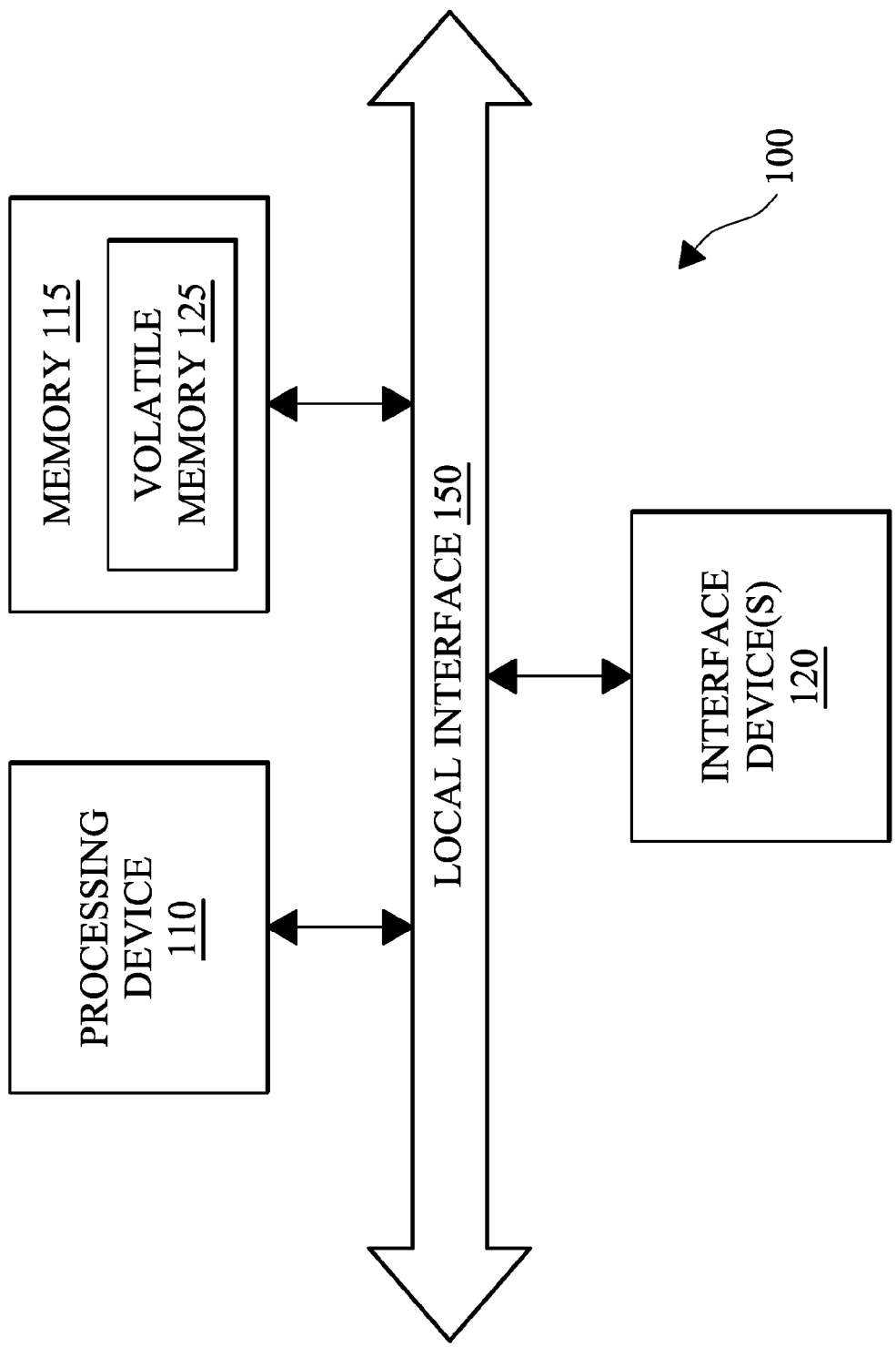
FIG. 1 is a block diagram that illustrates a system having a memory in accordance with an embodiment of the present disclosure.

FIG. 1 is a block diagram that illustrates a system 100 having a memory 125 in accordance with an embodiment of the present disclosure. The system 100 can be an exemplary architecture for a generic computer. The system 100 comprises a processing device 110, memory 115, and one or more user interface devices 120, each of which is connected to a local interface 150 (e.g., a bus). The processing device 110 can include any custom made or commercially available processor, a central processing unit (CPU) or an auxiliary processor among several processors associated with the generic computer, a semiconductor based microprocessor (in the form of a microchip), or a macroprocessor.

The one or more user interface devices 120 comprise those components with which the user (e.g., administrator) can interact with the system 100. Where the system 100 comprises a server computer or similar device, these components can comprise those typically used in conjunction with a PC such as a keyboard and mouse.

The memory 115 normally comprises various programs (in software and/or firmware) including an operating system (O/S) (not shown). The O/S controls the execution of programs, and provides scheduling, input-output control, file and data management, memory management, and communication control and related services. The memory 115 can include any one or a combination of memory 125 (e.g., random access memory (RAM, such as DRAM, SRAM, etc.)) and nonvolatile memory (e.g., ROM, hard drive, tape, CDROM, etc.) (not shown). The architecture of the memory 115 is further described in connection with FIGS. 2-6.

Figure 2:
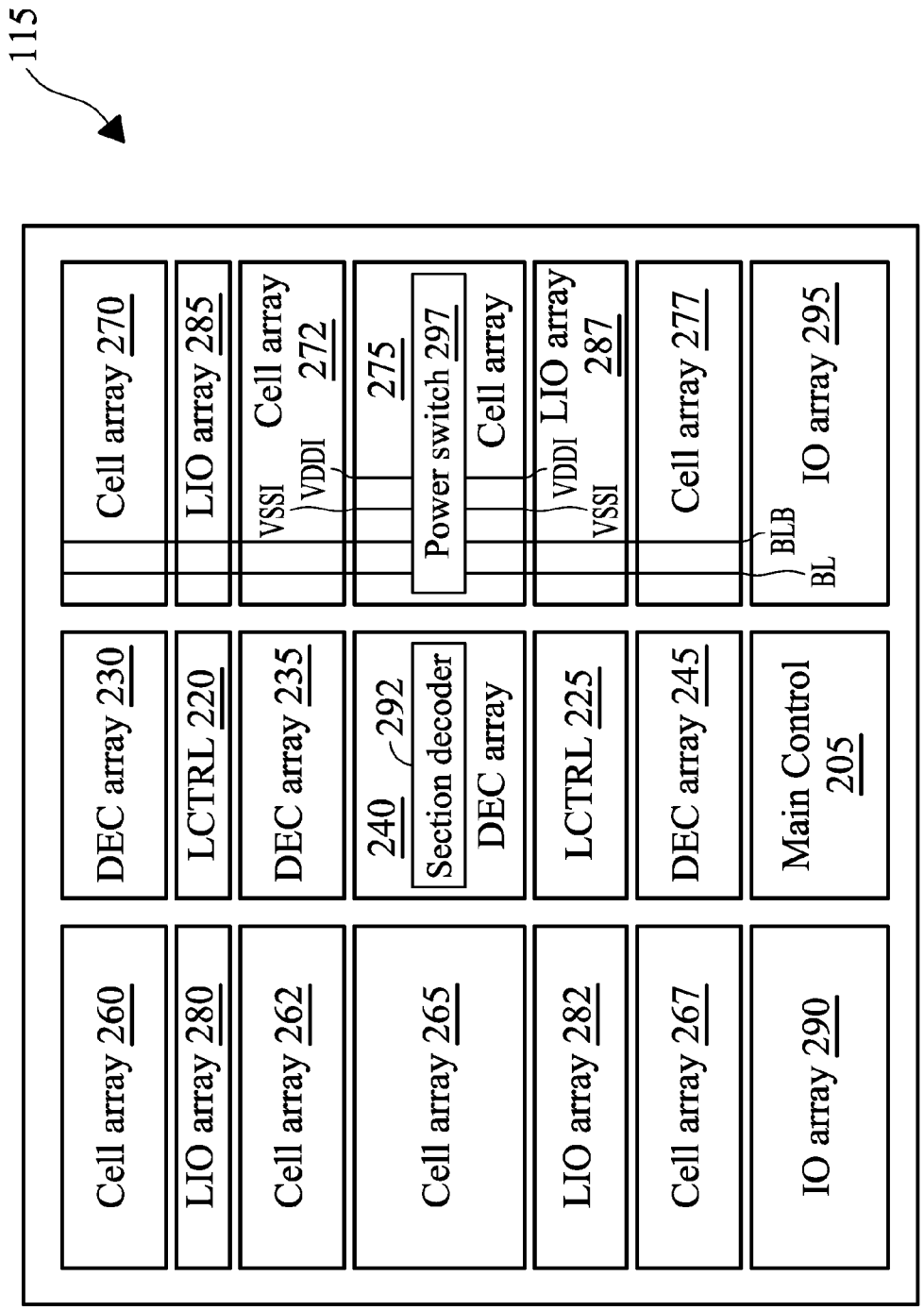
FIG. 2 is a block diagram of a memory in accordance with an embodiment of the present disclosure.

FIG. 2 is a block diagram of a memory 115, such as that shown in FIG. 1. In this example, the memory 115 can be the volatile memory 125, e.g., static random access memory (SRAM). The volatile memory 125 includes a main control 205 that sends signals to decoder arrays 230, 235, 240, 245 and the local control circuits 220, 225. In general, the function of the main control 205 is to control operations of the volatile memory 125 by effecting switching and addressing functions. These included, for example read and write functions, address pre-decode for selecting, for example, a word line driver, chip enable/disable functions, self timing generation, and communication through input/output (I/O) arrays 290, 295, among others. The function of the local control circuits 220, 225 is to control local input/output (I/O) array 280, 282, 285, 287 for local bit line pre-charge, write pass gate, and sense amplifier enable, among others.

The local control circuits 220, 225 receives instructions from the main control 205 to turn on or off a memory cell array 260, 262, 265, 267, 270, 272, 275, 277. The local control circuits 220, 225 use the local input/output arrays 280, 285 to communicate with memory cell arrays 260, 265, 270, 275. Input/output arrays 290, 295 are used to receive or send digital information stored in memory cell arrays 260, 262, 265, 267, 270, 272, 275, 277 to and from other electrical components such as the processing device 110 and/or user interface device 120 (FIG. 1). The local input/output arrays 280, 282, 285, 287 and input/output arrays 290, 295 are briefly mentioned to provide a system overview.

The volatile memory 125 can further include decoder arrays 230, 235, 240, 245 that facilitate operating bit cells 405 (FIG. 4) of the volatile memory 125 during the read and write operations. In this example, the decoder arrays 240 include one or more section decoders 292 and the cell array 275 includes one or more power switches 297. Other decoder arrays 230, 235, 245 and cell arrays 260, 262, 265, 267, 270, 272, 277 can also include section decoders 292 and power switches 297, respectively. The section decoder 292 can be coupled and can instruct the power switches 297 to connect either a first voltage or second voltage to the cell arrays 260, 262, 265, 267, 270, 272, 277. The section decoders 292 and power switches 297 are further described in connection with FIGS. 3-6.

Figure 3:
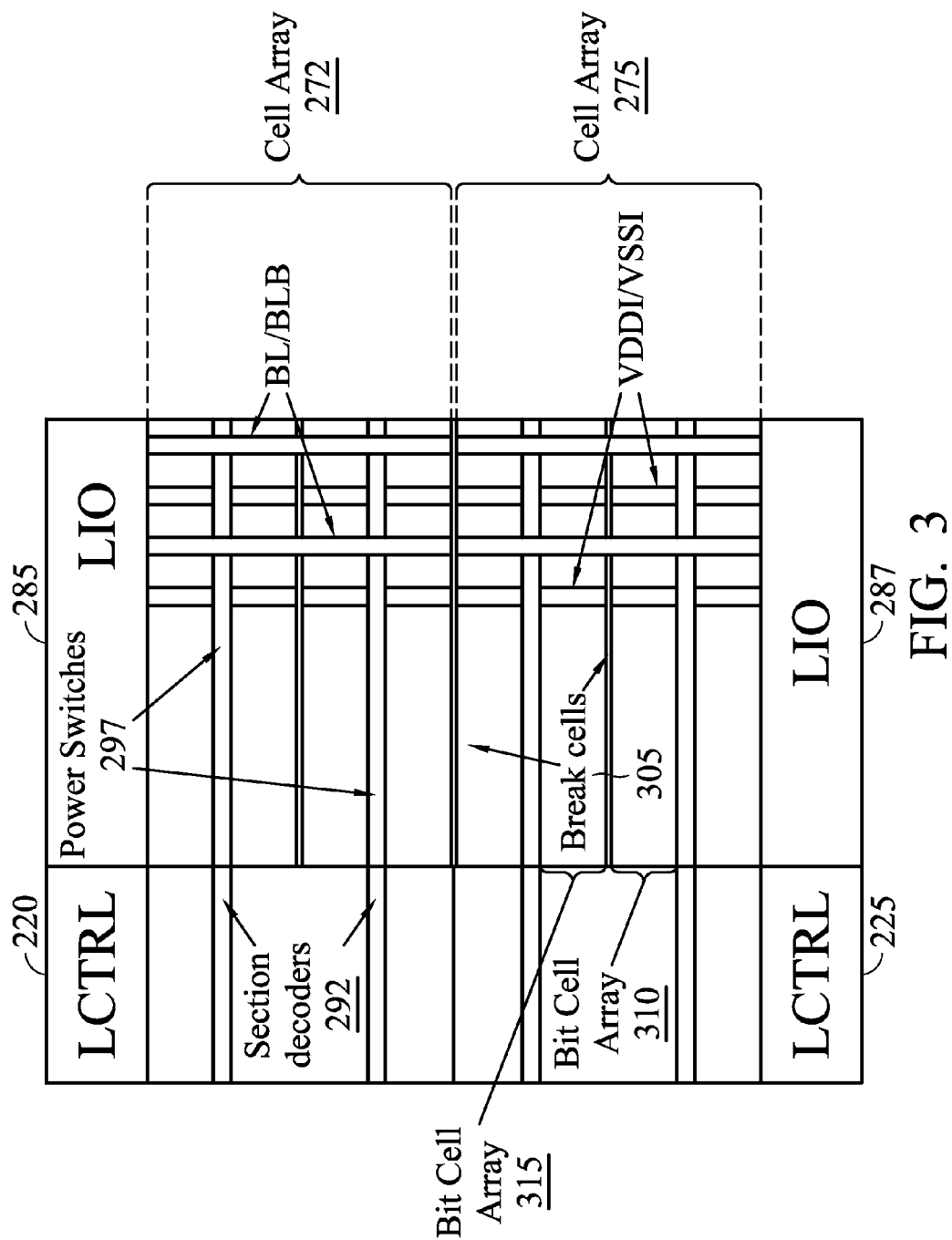
FIG. 3 is a layout diagram that illustrates a portion of a memory in accordance with an embodiment of the present disclosure.

FIG. 3 is a schematic diagram that illustrates a portion of a memory 115, such as that shown in FIG. 2, having local control circuits 220, 225, local input/output arrays 285, 287, and cell arrays 272, 275. In this example, the local input/output arrays 285, 287 are electrically coupled to the local control circuits 220, 225, respectively. A plurality of bit lines BL/BLB are electrically coupled to the local input/output arrays 285, 287. The local control circuits 220, 225 and the local input/output arrays 285, 287 can be implemented by using any control circuits and any input/output arrays and are not restricted to the local control circuits 220, 225, as depicted in FIG. 3.

The cell arrays 272, 275 are electrically coupled to the plurality of bit lines BL/BLB. Each cell array 272, 275 can be subdivided into one or more bit cell arrays 310, 315 by break cells 305. According to one aspect, at least one break cell 305 separates a connectivity of a first voltage (e.g., VDDI) and a second voltage (e.g., VSSI) between at least two bit cell arrays 310, 315. In other words, the break cells 305 delineate separate subsets (e.g., rows of bit cells 310, 315) of the bit cells 405 so that the subsets of the bit cells 405 (FIG. 4) can be powered independently of other subsets.

A plurality of bit lines BL/BLB are coupled to the cell arrays 272, 275. The power switches 297 are electrically coupled to the bit cell 405. Each separated bit cell array 310, 315 of the cell array 272, 275 is controlled by the power switches 297 for connecting to either the first voltage (e.g., VDDI) or second voltage (e.g., VSSI) to the separated row of bit cells 310, 315. The section decoders 292 are coupled and can instruct the power switches 297 to connect either the first voltage (e.g., VDDI) or second voltage (e.g., VSSI) to each separated bit cell array 310, 315. The power/ground lines connected to power switches 297 are cut in the break cells 305, separating the power/ground lines from the near-by or adjacent bit cell array 310, 315 at two sides of the break cell 305. In other words, the break cells 305 cut the power/ground lines between bit cell arrays 310, 315, resulting in smaller bit cell arrays 310, 315 which can speed up the charge and discharge times and reduce power consumption.

Figure 4:
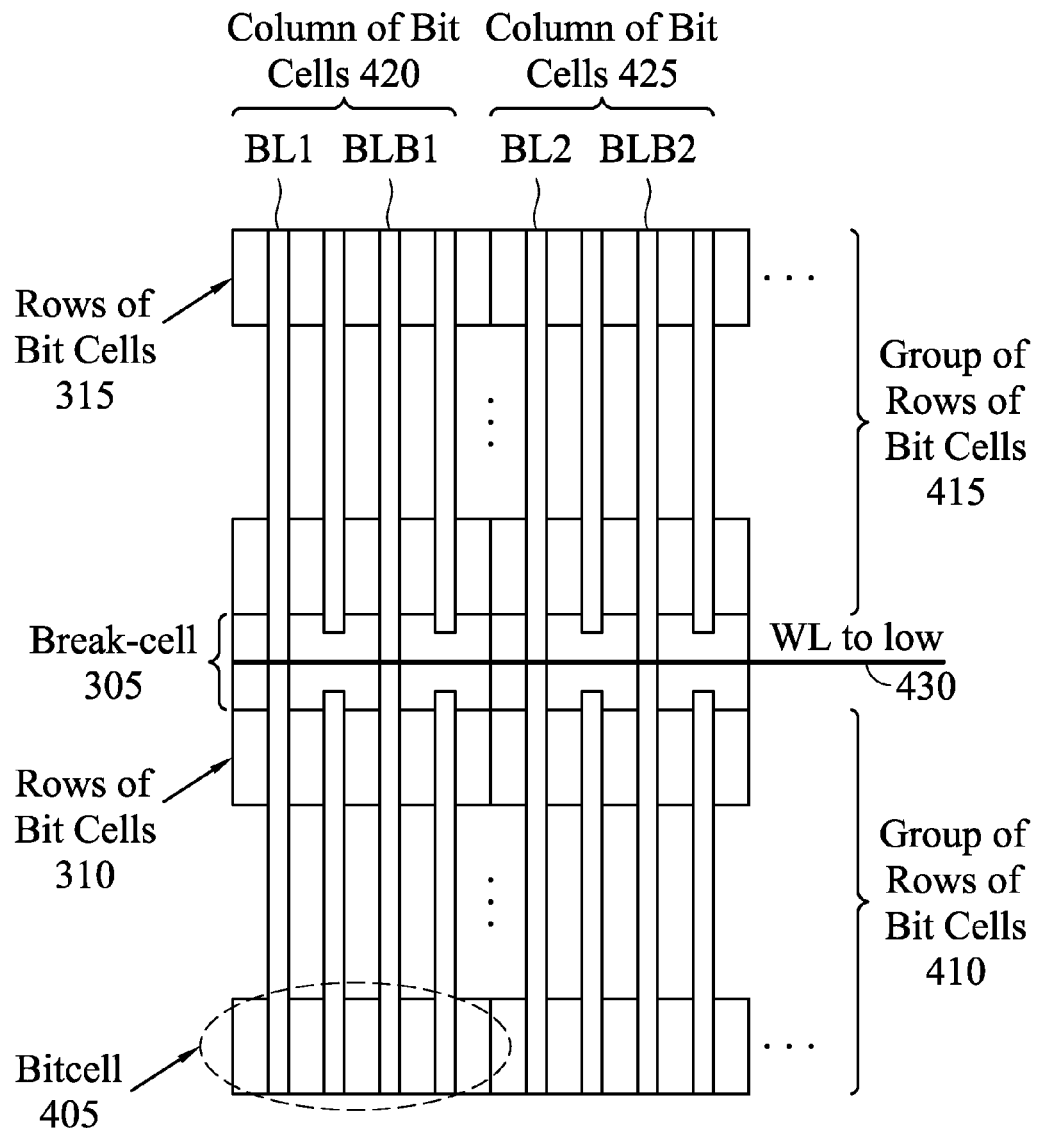
FIG. 4 is a layout diagram that illustrates an additional aspect of a memory in accordance with an embodiment of the present disclosure.

FIG. 4 is a layout diagram that illustrates an additional aspect of a memory 115 (FIG. 2) between power switches 297 (FIG. 3). The bit cell arrays can be arranged in rows of bit cells 310, 315 or columns of bit cells 420, 425, both of which include at least one bit cell 405. The rows of bit cells 310, 315 can be grouped together forming groups of rows of bits cells 410, 415. Similarly, the columns of bit cells 420, 425 can be grouped together forming groups of columns of bits cells 420, 425.

The break cell 305 can be made of modified materials from the bit cells 405 because the bit cell array 310, 315 is sensitive to surrounding layout patterns (e.g. poly, diffusion, and etc). One solution to this sensitivity is designing the break cells 305 to have substantially similar patterns of near-by (or adjacent) bit cells 405. The break cells 305, however, further include word lines 430 that are connected to a low voltage to turn off a pass transistor in the bit cell 405, and the VDDI/VSSI metal lines are removed from the break cells 305.

Alternatively or additionally, the bit cells 405 can be arranged into one or more columns of bit cells 420, 425. Although not shown, a break cell 305 can separate a connectivity of a first voltage or second voltage between at least two columns of bit cells 420, 425 of the cell array, similar to that shown in FIG. 4. Each separated column of bit cells 420, 425 of the cell array is controlled by the one or more power switches 297 for connecting to either the first voltage or second voltage to the separated column of bit cells 420, 425. The section decoders 292 can be coupled and instructs the power switches 297 to connect either the first voltage or second voltage to each separated column of bit cells 420, 425.

Figure 5:
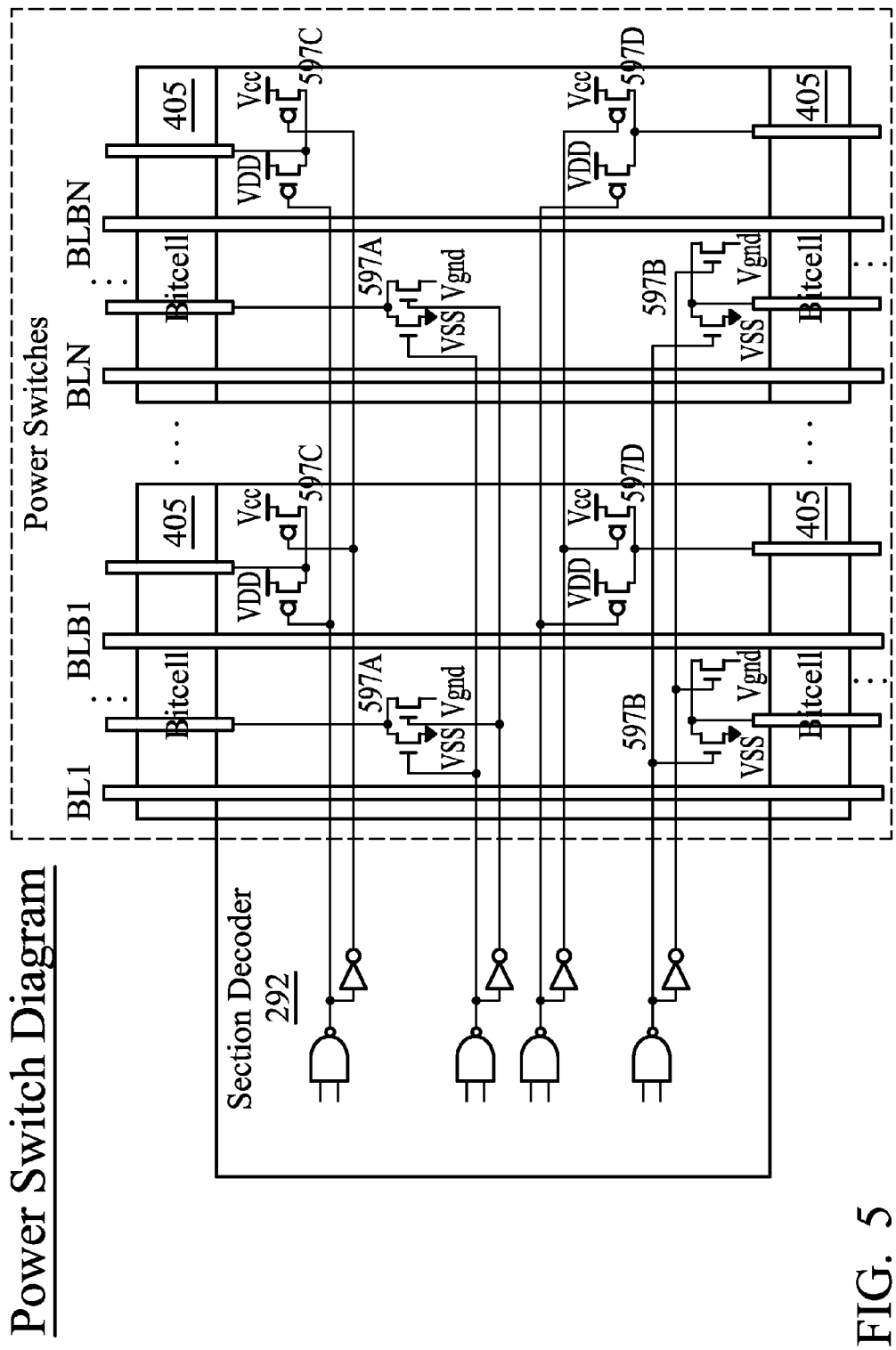
FIG. 5 is a circuit-layout diagram that illustrates a portion of a memory in accordance with another embodiment.

FIG. 5 is a circuit-layout diagram that illustrates a portion of a memory 115 in accordance with yet another embodiment of the present disclosure. In this example, the section decoder 292 can be implemented with NAND gates and inverters. The power switches 597A-C in this configuration can connect the bit cells 405 selectively to four different voltages, such as VSS, Vgnd, VDD, and Vcc. The power switches 597A-B can connect the bit cells 405 to either the VSS or Vgnd, and the power switches 597C-D can connect the bit cells 405 to either the VDD or Vcc. An exemplary operation of the memory 115 is described as follows. In the data retention mode, the bit cells 405 are coupled to Vgnd at VSSI and VDD at VDDI. In an operational mode such as a write operation or a write-assist operation requiring additional operational voltage, the bit cells 405 are coupled to VSS at VSSI and VDD or VCC at VDDI.

Figure 6:
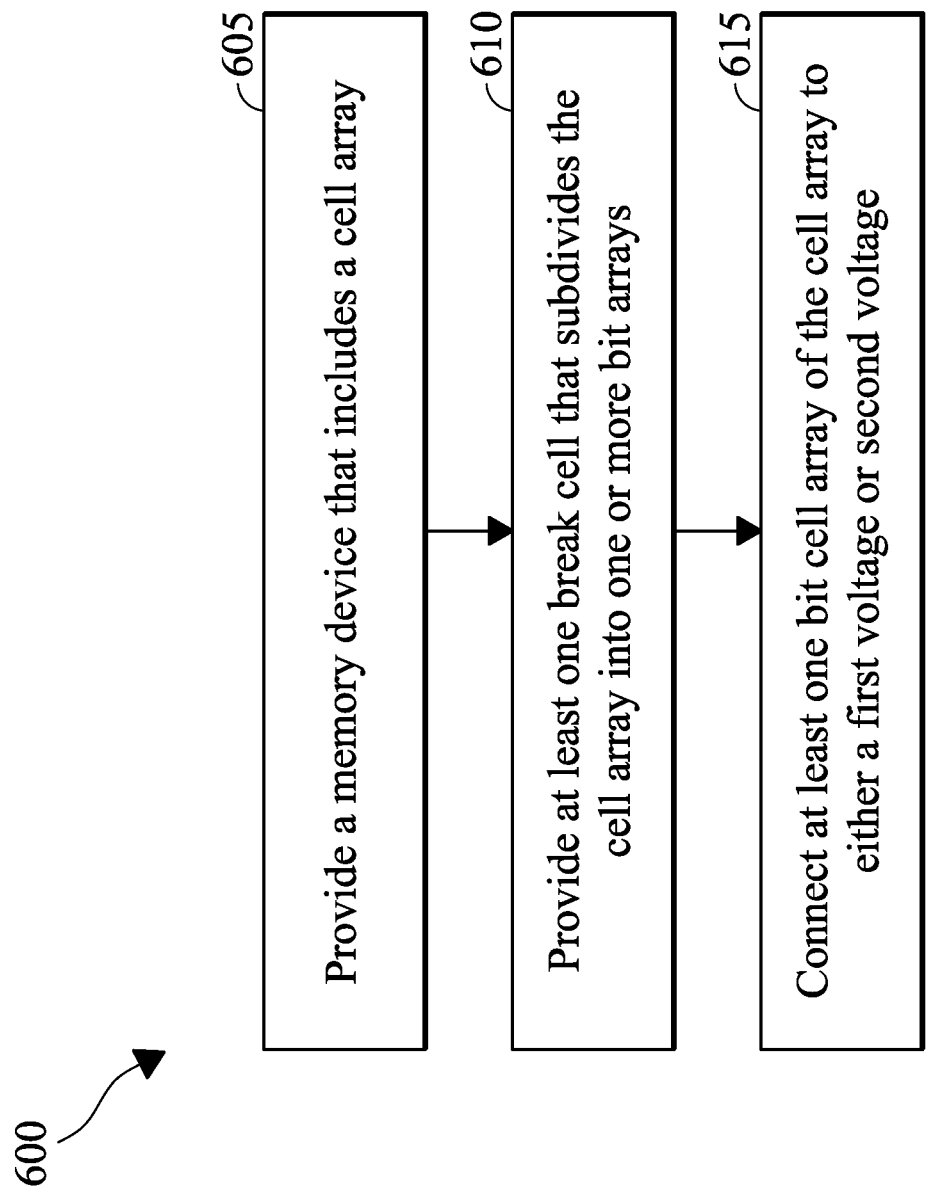
FIG. 6 is a flow diagram that illustrates an embodiment of the architecture, functionality, and/or operation of a memory device in accordance with an embodiment of the present disclosure.

FIG. 6 is a flow diagram 600 that illustrates an embodiment of the architecture, functionality, and/or operation of the memory device 115, such as that shown in FIG. 1. The flow diagram 600 begins with block 605, which provides the memory device 115 to include a cell array 272, 275. In block 610, the memory device 115 is provided with at least one break cell 305 that subdivides the cell array 272, 275 into one or more bit cell arrays 310, 315. The break cell 305 separates a connectivity of a first voltage and a second voltage between at least two bit cell arrays 310, 315. In block 615, one or more power switches 297 of the memory device 115 connect at least one separated bit cell array 310, 315 of the cell array 272, 275 to either the first voltage or second voltage.

To control the power switches 297, a control circuit 220, 225 can send instruction signals to a section decoder 292 that instructs the power switches 297 to connect either the first voltage or second voltage to the at least one separated bit cell array 310, 315 based on the instruction signals. The section decoder 292 can instruct the power switches 297 by sending control signals to the power switches 297 that control the connection of each separated bit cell array 310, 315 of the cell array 272, 275 to either the first voltage or second voltage based on the control signals.

Alternatively or additionally, the step in block 605 can include providing the bit cell arrays 310, 315 that include one or more rows or columns of bit cells. The step in block 610 can include the step of separating the connectivity of the first voltage or second voltage between at least two rows or columns of bit cells of the cell array. Accordingly, the control circuit 220, 225 can send instruction signals to the section decoder 292 that instructs the power switches 297 to connect either the first voltage or second voltage to the at least one separated row or column of bit cells based on the instruction signals. The section decoder 292 can instruct the power switches 297 by sending the control signals to power switches 297 that control a connection of at least one separated row or column of bit cells of the cell array to either the first voltage or second voltage based on the control signals.

Some of the advantages of the architecture, operation, and functionality of the memory 115 previously described are that the section decoders 292 can select which rows (or columns) of bit cells to switch from a retention mode to an operational mode or switching from/to a write-assist mode. The power switches 297 can be used to charge and discharge VDDI/VSSI at different selected subsets of the bit cells 405, either individually or in combinations of subsets such as selected rows and/or columns. Inasmuch as the VDDI/VSSI are applied to subsets such as rows of bit cells 310, 315, there is less capacitance involved in the subset of bit cells 405 that are switched into operational mode and the overall active power consumption is reduced during wake up compared to an arrangement wherein all or a larger portion of the memory cells were made operational at that same time. Non-accessed bits remain in retention mode to reduce static power consumption.

A representative memory device includes a cell array, at least one break cell that subdivides the cell array into bit cell arrays, and one or more power switches that are electrically coupled to the bit cell. In one embodiment, the break cell separates a connectivity of a first voltage and a second voltage between at least two bit cell arrays so that the bit cell arrays can be selectively coupled to either the first voltage or the second voltage using the power switches. The power switches control the connection of each separated bit cell array of the cell array to either the first voltage or second voltage. The cells that are required to be operational at a given time are selectively coupled between the different potentials that render the cells operational, by closing corresponding conductive circuits.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A semiconductor memory, comprising:
   a first break cell electrically separating a first subset of bit cells from a second subset of bit cells of a cell array; and
   a first power switch configured to connect the first subset of bit cells to a first voltage during a first operating mode and to a second voltage that is different from the first voltage during a second operating mode,
   wherein the first break cell includes a modified material from a material from which the first and second subsets of bit cells are formed.

2. The semiconductor memory of claim 1, wherein the first operational mode is a data retention mode, and the second operational mode is a write mode.

3. The semiconductor memory of claim 1, further comprising a section decoder that is coupled to the first power switch, wherein the section decoder instructs the first power switch to connect the first subset of bit cells to either the first voltage or to the second voltage.

4. The semiconductor memory of claim 1, further comprising a second power switch configured to connect the second subset of bit cells to the first voltage during the first operating mode and to the second voltage that is different from the second voltage during the second operating mode, wherein the second power switch is configured to operate independently of the first power switch.

5. The semiconductor memory of claim 4, further comprising a section decoder that is coupled to the first and second power switches, wherein the section decoder instructs the first power switch and the second power switch independent of one another to connect the first subset of bit cells to either the first voltage or to second voltage and to connect the second subset of bit cells to either the first voltage or to the second voltage.

6. The semiconductor memory of claim 1, further comprising a local input/output array that is coupled to bit lines coupled to at least one of the first and second subsets of bit cells.

7. The semiconductor memory of claim 6, further comprising at least one local control circuit that is electrically coupled to the local input/output array.

8. A method, comprising:
   connecting a first subset of bit cells of a bit cell array to a first voltage when the first subset of bit cells of the bit cell array is in a first operating mode;
   connecting the first subset of bit cells to a second voltage when the first subset of bit cells is in a second operating mode;
   connecting a second subset of bit cells of the bit cell array to the first voltage when the second subset of bit cells is in the first operating mode; and
   connecting the second subset of bit cells to the second voltage when the second subset of bit cells is in the second operating mode,
   wherein the first and second subsets of bit cells are electrically separated from one another by a break cell such that the first and second subsets of bit cells, are controlled independent of one another, and
   wherein the break cell includes a modified material from a material from which the first and second subsets of bit cells are formed.

9. The method of claim 8, wherein the first subset of bit cells is in the first operating mode at a different time from when the second subset of bit cells is in the first operating mode.

10. The method of claim 8, wherein the first subset of bit cells is connected to the first and second voltages in response to receiving control signals at a first power switch that is connected to the first subset of bit cells, and the second subset of bit cells is connected to the first and second voltages in response to receiving control signals at a second power switch that is connected to the second subset of bit cells.

11. The method of claim 8, further comprising:
   providing a first control signal to a first power switch that is connected to the first subset of bit cells, the first control signal for instructing the first power switch to connect the first subset of bit cells to the first voltage or to the second voltage; and providing a second control signal to a second power switch that is connected to the second cell array, the second control signal for instructing the second power switch to connect the second subset of bit cells to the first voltage or to the second voltage.

12. A semiconductor memory, comprising:
a first break cell electrically separating a first subset of bit cells from a second subset of bit cells of a cell array;
a first power switch configured to connect the first subset of bit cells to a first voltage during a first operating mode and to a second voltage that is different from the first voltage during a second operating mode; and
a second power switch configured to connect the second subset of bit cells to the first voltage during the first operating mode and to the second voltage during the second operating mode,
wherein the first and second power switches are controlled independently such that the first subset of bit cells can be in a different operating mode from the second subset of bit cells at a given point in time, and
wherein the break cell includes a modified material from a material from which the bit cells of the first and second subsets of bit cells are formed.

13. The semiconductor memory of claim 12, wherein the first operational mode is a data retention mode, and the second operational mode is a write mode.

14. The semiconductor memory of claim 12, further comprising a section decoder that is coupled to the first power switch, wherein the section decoder instructs the first power switch to connect the first subset of bit cells to either the first voltage or to second voltage.

15. The semiconductor memory of claim 12, further comprising a section decoder that is coupled to the first and second power switches for controlling the first and second power switches.

16. The semiconductor memory of claim 12, further comprising a local input/output array that is coupled to bit lines coupled to at least one of the first and second subsets of bit cells.

17. The semiconductor memory of claim 16, further comprising at least one local control circuit that is electrically coupled to the local input/output array.

18. The semiconductor memory of claim 12, wherein the break cell includes a word line connected to a low voltage such that a pass transistor in the break cell is turned off.

* * * * *

UNITED STATES PATENT AND TRADEMARK OFFICE
CERTIFICATE OF CORRECTION

| | | |
|---|---|---|
| PATENT NO. | : 8,743,581 B2 | Page 1 of 1 |
| APPLICATION NO. | : 13/765704 | |
| DATED | : June 3, 2014 | |
| INVENTOR(S) | : Yukit Tang et al. | |

It is certified that error appears in the above-identified patent and that said Letters Patent is hereby corrected as shown below:

In the Claims

Claim 8, Column 6, Line 49 – delete the word "cells," and insert -- cells --.

Signed and Sealed this
Twentieth Day of January, 2015

Michelle K. Lee
*Deputy Director of the United States Patent and Trademark Office*